(12) United States Patent
Guida

(10) Patent No.: US 6,700,136 B2
(45) Date of Patent: Mar. 2, 2004

(54) LIGHT EMITTING DEVICE PACKAGE

(75) Inventor: Renato Guida, Wyantskill, NY (US)

(73) Assignee: General Electric Company, Niskayuna, NY (US)

( * ) Notice: Subject to any disclaimer, the term of this patent is extended or adjusted under 35 U.S.C. 154(b) by 58 days.

(21) Appl. No.: 09/682,163

(22) Filed: Jul. 30, 2001

(65) Prior Publication Data
US 2003/0020081 A1 Jan. 30, 2003

(51) Int. Cl.[7] ................................. H01L 21/00
(52) U.S. Cl. ..................... 257/79; 257/80; 257/82; 257/88; 257/98; 257/432; 257/433
(58) Field of Search .................. 438/26, 106; 257/79, 257/80, 82, 88, 98, 81, 99, 100, 431, 432, 433; 156/64, 307.3

(56) References Cited

U.S. PATENT DOCUMENTS 5,886,401 A   3/1999   Liu

2002/0123163 A1 * 9/2002 Fujii ........................ 438/26

OTHER PUBLICATIONS

U.S. patent application Ser. No. 09/681,599 Filed May 4, 2001, Entitled "Surface Mount Light Emitting Device Package and Fabrication Method".*

U.S. patent application Ser. No. 09/654,163 filed Sep. 1, 2000, Entitled "Plastic Packaging of LED Arrays" by K.M. Durocher, et al.

* cited by examiner

Primary Examiner—W. David Coleman
Assistant Examiner—Khiem Nguyen
(74) Attorney, Agent, or Firm—Ann M. Agosti; Patrick K. Patnode

(57) ABSTRACT

A light emitting device (LED) package comprises: a thermally conductive layer; an electrically insulating layer having openings extending therethrough; LEDs situated within the openings of the electrically insulating layer and including contact pads; and electrically conductive strips attached to the contact pads and the electrically insulating layer.

23 Claims, 3 Drawing Sheets

LIGHT EMITTING DEVICE PACKAGE

BACKGROUND OF INVENTION

The invention relates generally to light emitting devices (LEDs) and more particularly to packaging of light emitting devices. It would be desirable to provide a quick and inexpensive method for fabricating flexible LED packages.

SUMMARY OF INVENTION

Briefly, in accordance with one embodiment of the present invention, A flexible light emitting device (LED) package comprises: a thermally conductive layer; an electrically insulating layer having openings extending therethrough; LEDs situated within the openings of the electrically insulating layer and including contact pads; and electrically conductive strips attached to the contact pads and the electrically insulating layer.

BRIEF DESCRIPTION OF DRAWINGS

These and other features, aspects, and advantages of the present invention will become better understood when the following detailed description is read with reference to the accompanying drawings in which like characters represent like parts throughout the drawings, wherein.

DETAILED DESCRIPTION

Figure 1:
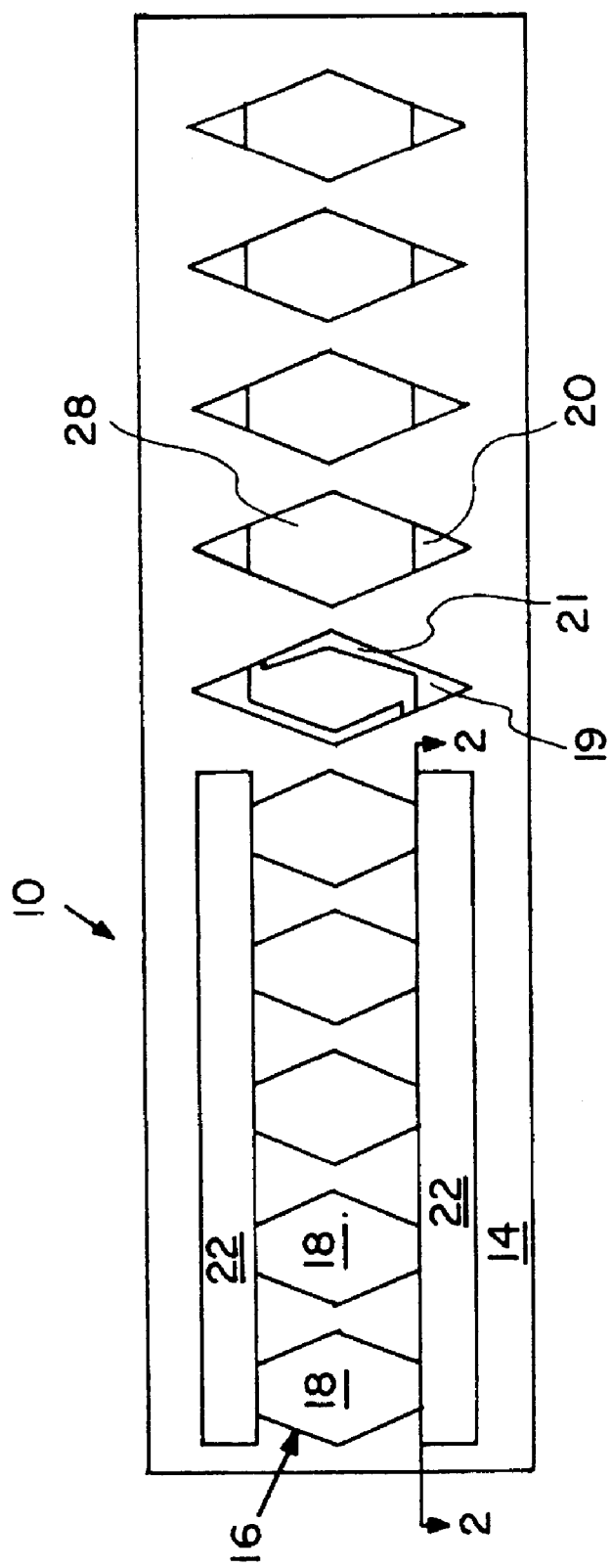
FIG. 1 is a top view of a light emitting device (LED) package in accordance with one embodiment of the present invention.
Figure 2:
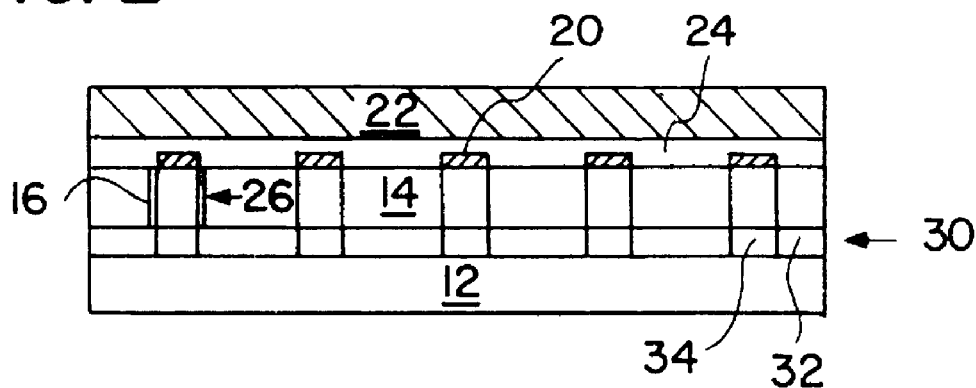
FIG. 2 is a side view of the LED package of FIG. 1.
Figure 3:
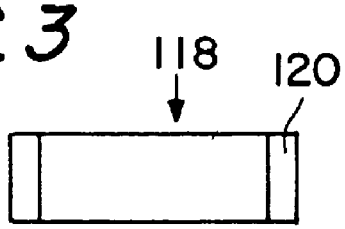
FIGS. 3–6 are top views of several alternative example LED shapes for use in the embodiment of FIG. 1.
Figure 4:
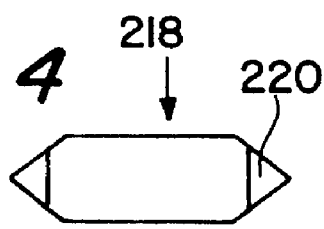
Figure 5:
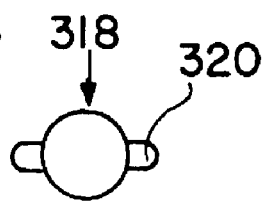
Figure 6:
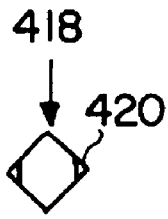

FIG. 1 is a top view of a flexible light emitting device (LED) package 10 in accordance with one embodiment of the present invention, and FIG. 2 is a side view of the LED package of FIG. 1. In one embodiment, LED package 10 is fabricated by providing an electrically insulating layer 14 having openings 16 extending therethrough over a thermally conductive layer 12; situating LEDs 18 including contact pads 20 within the openings of the electrically insulating layer; and attaching electrically conductive strips 22 to the contact pads and the electrically insulating layer.

As used herein, "flexible" means capable of being bent in the direction of its length and being twisted in the direction of its width with the radius of curvature and the degree of twisting being functions of the materials used and the density of the LEDs; and "thermally conductive" is meant to include materials having coefficients of thermal conductivity large enough to ensure proper heat dissipation under normal operating conditions according to the application of the LED package.

It is useful for thermally conductive layer 12 to comprise a material which is transparent, translucent, or reflective in the emission spectrum of the LED. Transparent or translucent materials are useful if a double-sided emission type LED package is desired. If opaque materials are used, it is useful for thermally conductive layer 12 to comprise a reflective material either as the entire layer or as a sublayer (not shown) situated at or near the surface of the thermally conductive layer which faces the LEDs to increase the optical efficiency of the LED package. Thermally conductive layer 12 serves to dissipate the heat generated by the LEDs and provides a supporting base for the LED package. The material and thickness of the thermally conductive layer are selected such that the resulting package can remain flexible. Specific examples of materials for thermally conductive layer 12 include, metals such as copper, aluminum, and thermally conductive composites such as carbon particles with plastic binders, for example. Typical thicknesses of the thermally conductive layer are expected to be on the order of about 50 micrometers to about 100 micrometers, for example.

Electrically insulating layer 14 (FIG. 2) may comprise a plastic or other electrically insulating material capable of withstanding processing and operating temperatures of the LED package. In one embodiment, the electrically insulating layer comprises a polyimide such as KAPTON ™ polyimide (KAPTON is a trademark of DuPont Co.), for example. When the selected material for electrically insulating layer 14 comprises a transparent material, overall emission efficiency is further improved. When the selected material for electrically insulating layer 14 comprises a thermally conductive layer, heat dissipation of the LEDs is improved. The thickness of electrically insulating layer 14 is sufficiently similar to the thickness of the LEDs to ensure a good bond of conductive strips 22 to both the electrically insulating layer and the LED contact pads, and the material and thickness of electrically insulative layer 14 are additionally selected such that the resulting package can remain flexible. Typical LED thicknesses are on the order of about 200 micrometers, for example.

Openings 16 in electrically insulating layer 14 may be formed by mechanical or laser machining, for example. Although the openings may be formed either prior to or after attaching electrically insulating layer 14 to thermally conductive layer 12, less risk of damage to the underlying thermally conductive layer 12 occurs if openings 16 are formed prior to attachment. In one embodiment, electrically insulating layer 14 is attached to thermally conductive layer 12 by an adhesive 32 which may be positioned on either of layers 12 or 14 prior to attachment of the electrically insulating layer. The shape of each opening is selected to be slightly larger than the perimeter of the respective LED for the opening and to thus aid in positioning, aligning, and containing the respective LED. In one embodiment, gaps 26 (FIG. 2) between LEDS and electrically insulating layer 14 are on the order of about twenty micrometers, for example.

LEDs 18 comprise light emitting semiconductor devices such as light emitting diodes, for example. LEDs 18 may be fabricated using conventional techniques, but most efficient use of space can be achieved by modifying the conventional LED shape and/or contact pad layout as shown in the examples of FIGS. 1 and 3–6 such that the electrically conductive strips 22, when properly aligned, do not overlap the active areas 28 of the LEDs 18 (and thus provide about 100% optical emission efficiency) and such that even if one or both of the strips are misaligned, overlap of the active areas of the LEDs is minimized.

LEDs 18 may be positioned directly on thermally conductive layer 12 and held in place by conductive strips 22 or LEDs 18 may be attached to thermally conductive layer 12 using a thermally conductive adhesive 34. In one embodiment, an adhesive 30 coupling thermally conductive layer 12 and electrically insulating layer 14 is thermally conductive and is also used for coupling LEDs 18 to thermally conductive layer 12.

As discussed above with respect to thermally conducting layer 12 and electrically insulating layer 14, the material and thickness of electrically conductive strips 22 are selected such that the resulting package can remain flexible. Electrically conductive strips 22 may comprise materials such as rolled copper or aluminum, for example, and typically have thicknesses ranging from about 50 micrometers to about 100 micrometers, for example. In one embodiment, the electrically conductive strips are attached by situating an electrically conductive adhesive 24 between the electrically conductive strips 22 and the contact pads 20 and the electrically insulating layer 14. In a more specific embodiment, situating adhesive 24 comprises attaching adhesive 24 to electrically conductive strips 22 prior to attaching electrically conductive strips 22 to contact pads 20 and electrically insulating layer 14. Electrically Conductive strips 22 may be applied to the surface with light pressure and then cured using heat or ultraviolet light, for example.

FIGS. 3–6 are top views of several alternative example LED shapes for use in the embodiment of FIG. 1. The present invention is not limited to the specific shapes illustrated in FIGS. 1 and 3–6. The rhomboidal (FIG. 1), rectangular (FIG. 3), stretched hexagonal (FIG. 4), modular/pronged (FIG. 5), and diamond (FIG. 6) shapes shown in FIGS. 1 and 3–6 are for purposes of example. The positions of contact pads 19, 20, 120, 220, 320, and 420 on LEDs 18, 118, 218, 318, and 418 are also for purposes of example and are not intended to limit the scope of the invention. It may be useful to have metallization extend beyond the contact pad 19 region (as shown by metallization 21 in FIG. 1) to facilitate a more uniform voltage gradient for more uniform light emission.

The previously described embodiments of the present invention have many advantages, including ease of fabrication, maximization of optical coupling efficiency of light from active areas 28 of LEDs 18, and flexibility of the resulting package. For example, the LEDs may be packaged in a continuous ribbon type configuration for ease of fabrication, storage, and/or transport.

Figure 7:
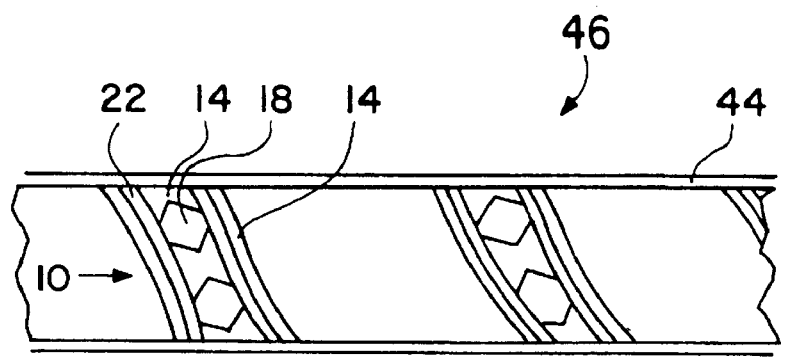
FIG. 7 is a perspective view of a light source including an LED package in accordance with one embodiment of the present invention.

FIG. 7 is a perspective view of a light source 46 including an LED package 10 in accordance with one embodiment of the present invention wherein the flexible LED package is situated a sufficiently transparent or translucent container 44 such that the LEDs are adapted for emitting light outside the container. Although in the specific example of FIG. 7 container 44 comprises a tube which may be useful for fluorescent bulb type fixtures, the present invention is not intended to be limited to a particular shape. Example materials for container 44 include materials such as glass-based materials or plastic-based materials.

In one example of an embodiment of FIG. 7, the materials and dimensions of the LED package are selected such that the resulting package has a radius of curvature as small as 40 mm and can be wrapped around a cylinder (not shown) of radius as small as 5 mm which can be used to facilitate insertion of the LED package within container 44. When LED packages are inserted within containers, the containers can provide protection from corrosion or other damage.

Figure 8:
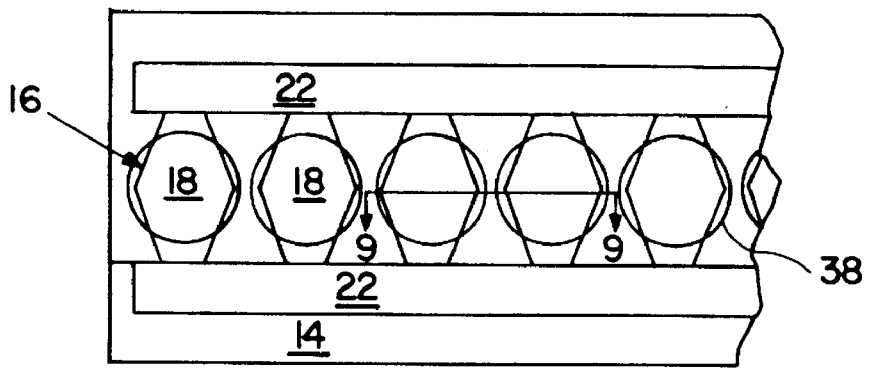
FIGS. 8 and 9 are respective top and side views of an LED package in accordance with another embodiment of the present invention.
Figure 9:
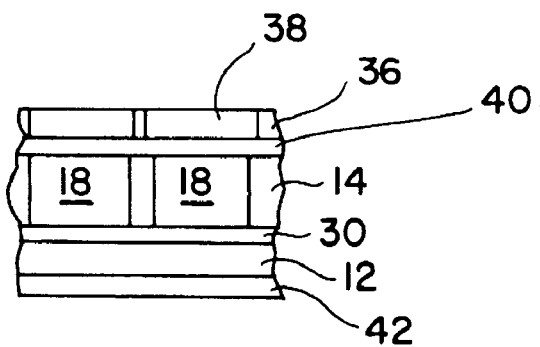

FIGS. 8 and 9 are respective top and side views of an LED package in accordance with another embodiment of the present invention wherein one or more protective layers 36 and/or 42 are applied to the package. In the example of FIG. 9, protective layer 36 overlies LEDs 18 and electrically conductive strips 22. Typically an adhesive 40 will be present between the protective layer and the LEDs.

If desired, protective layer 36 may include one or more lenses 38 for focussing light emitted from the LEDs. Lenses 38 may be situated in protective layer 36 either prior to or after applying protective layer 36 to the LED package and/or lenses 38 may be formed from the same layer as protective layer 36 by stamping, for example. Example lens materials include polycarbonates. The protective layer can be selected to comprise a transparent or translucent material such as a polycarbonate, for example. Additionally, if desired, the LED package may further a second protective layer 42 overlying the thermally conductive layer.

While only certain features of the invention have been illustrated and described herein, many modifications and changes will occur to those skilled in the art. It is, therefore, to be understood that the appended claims are intended to cover all such modifications and changes as fall within the true spirit of the invention.

What is claimed is:

1. A flexible light emitting device (LED) package comprising:
   a thermally conductive layer;
   an electrically insulating layer having openings extending therethrough;
   LEDs situated within the openings of the electrically insulating layer and including contact pads; and
   electrically conductive strips attached to the contact pads and the electrically insulating layer.

2. The LED package of claim 1 wherein the thermally conductive layer comprises a translucent material.

3. The LED package of claim 1 wherein the thermally conductive layer comprises a reflective material.

4. The LED package of claim 1 wherein the thermally conductive layer comprises a transparent material.

5. The LED package of claim 4 wherein the electrically insulating layer comprises a transparent material.

6. The LED package of claim 1 wherein the electrically insulating layer comprises a thermally conductive layer.

7. The LED package of claim 1 further comprising an adhesive between the electrically conductive strips and the contact pads and the electrically insulating layer.

8. The LED package of claim 1 wherein a shape of each LED is selected from the group consisting of diamond, rectangular, rhomboidal, stretched hexagonal, and pronged shapes.

9. The LED package of claim 1 further comprising a protective layer overlying the LEDs and the electrically conductive strips.

10. The LED package of claim 9 wherein the protective layer includes at least one lens for focusing light emitted from the LEDS.

11. The LED package of claim 9 wherein the protective layer is a transparent or translucent material.

12. The LED package of claim 9 further comprising a second protective layer overlying the thermally conductive layer.

13. A flexible light emitting device (LED) package comprising:
   a thermally conductive layer;
   an electrically insulating layer having openings extending therethrough;
   LEDs situated within the openings of the electrically insulating layer and including contact pads; and
   electrically conductive strips attached by an adhesive to the contact pads and the electrically insulating layer, the LEDs being shaped such that the electrically conductive strips, when properly aligned, do not overlap active areas of the LEDs.

14. The LED package of claim 13 wherein the thermally conductive layer comprises a translucent material and the electrically insulting layer comprises a translucent material.

15. The LED package of claim 13 wherein the thermally conductive layer comprises a reflective material.

16. The LED package of claim 13 wherein the electrically insulating layer comprises a thermally conductive layer.

17. The LED package of claim 13 further comprising a protective layer overlying the LEDs and the electrically conductive strips, the protective layer including at least one lens for focussing light emitted from the LEDs.

18. A light source comprising:
   a container, the container comprising a translucent or transparent material; and
   a flexible light emitting device (LED) package comprising a thermally conductive layer, an electrically insulating layer having openings extending therethrough, LEDs situated within the openings of the electrically insulating layer and including contact pads, and electrically conductive strips attached to the contact pads and the electrically insulating layer, the flexible LED package being situated in the container such that the LEDs are adapted for emitting light outside the container.

19. The light source of claim 18 wherein the container comprises a tube.

20. The light source of claim 18 wherein the thermally conductive layer is a translucent, transparent, or reflective material.

21. The light source of claim 20 wherein the electrically insulating layer comprises a transparent material.

22. The LED package of claim 21 wherein the electrically insulating layer comprises a thermally conductive layer.

23. The LED package of claim 18 wherein a shape of each LED is selected from the group consisting of diamond, rectangular, rhomboidal, stretched hexagonal, and pronged shapes.

* * * * *